US012794433B2

(12) United States Patent
Igarashi et al.

(10) Patent No.: US 12,794,433 B2
(45) Date of Patent: Nov. 10, 2026

(54) CERAMIC ELECTRONIC COMPONENT

(71) Applicant: Murata Manufacturing Co., Ltd., Kyoto-fu (JP)

(72) Inventors: Takamori Igarashi, Nagaokakyo (JP); Yosuke Matsushita, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 57 days.

(21) Appl. No.: 18/955,216

(22) Filed: Nov. 21, 2024

(65) Prior Publication Data

US 2025/0088164 A1 Mar. 13, 2025

Related U.S. Application Data

(63) Continuation of application No. PCT/JP2023/018966, filed on May 22, 2023.

(30) Foreign Application Priority Data

May 24, 2022 (JP) ................................ 2022-084747

(51) Int. Cl.
*H03H 7/01* (2006.01)

(52) U.S. Cl.
CPC ................................ *H03H 7/0153* (2013.01)

(58) Field of Classification Search
CPC .................................................. H03H 7/0153
See application file for complete search history.

(56) References Cited

U.S. PATENT DOCUMENTS

2016/0012950 A1* 1/2016 Nishino ............ H02K 41/0356 216/13
2018/0211765 A1* 7/2018 Nakaniwa .......... H01F 17/0033
2019/0379343 A1* 12/2019 Miyahara .............. H01G 4/224
2020/0288574 A1* 9/2020 Ito ......................... H05K 1/144

FOREIGN PATENT DOCUMENTS

JP 2012-253245 A 12/2012
JP 2013-084871 A 5/2013
JP 5482763 B2 5/2014
JP 2022-064955 A 4/2022
WO 2016/136653 A1 9/2016
WO 2017/082017 A1 5/2017
WO 2017/199734 A1 11/2017
WO 2018/159481 A1 9/2018
WO 2019/107131 A1 6/2019
WO 2021/215104 A1 10/2021

OTHER PUBLICATIONS

International Search Report for PCT/JP2023/018966 dated Jul. 4, 2023.

* cited by examiner

*Primary Examiner* — Samuel S Outten
(74) *Attorney, Agent, or Firm* — McDonald Hopkins LLC

(57) ABSTRACT

The ceramic electronic component includes a main body made of ceramic as a main material and having a first surface and a second surface facing each other, a dummy conductor disposed to cover at least a portion of an outer edge of a specific surface selected as at least one of the first surface and the second surface and electrically isolated therefrom, and land electrodes disposed on the second surface, and a ridge of an outer periphery of the specific surface of the main body is rounded.

20 Claims, 18 Drawing Sheets

<FIRST EMBODIMENT>

CERAMIC ELECTRONIC COMPONENT

CROSS REFERENCE TO RELATED APPLICATION

This is a continuation of International Application No. PCT/JP2023/018966 filed on May 22, 2023 which claims priority from Japanese Patent Application No. 2022-084747 filed on May 24, 2022. The contents of these applications are incorporated herein by reference in their entireties.

BACKGROUND OF THE DISCLOSURE

Field of the Disclosure

The present disclosure relates to a ceramic electronic component.

Description of the Related Art

WO 2017/199734A1 (PTL 1) describes a multilayer filter (also referred to as an "LC filter") that includes an LC resonator. This multilayer filter includes multiple dielectric layers stacked on each other and has a rectangular shape. A flat electrode is disposed as an LGA terminal on a bottom surface of the multilayer filter. An inductor and a capacitor are disposed inside the multilayer filter.

PTL 1: WO 2017/199734A1

BRIEF SUMMARY OF THE DISCLOSURE

In an LC filter including an LGA terminal, shell cracks may be caused to occur due to an external load after firing. In order to prevent the shell cracks, it is conceivable to round corners such as ridges in advance by barrel polishing. More barrel polishing can round the corners with a larger radius of curvature. When the amount of removal by barrel polishing is large, the overall shape of the multilayer filter changes from, for example, a rectangular shape to a shape with rounded corners in a plan view. Therefore, when the amount of removal by barrel polishing is large, a so-called design region becomes small.

Thus, the amount of removal by barrel polishing cannot be too large. In order to prevent shell cracks, methods other than barrel polishing should be considered.

Therefore, a possible benefit of the present disclosure is to provide a ceramic electronic component capable of preventing the occurrence of shell cracks without increasing the amount of removal by barrel polishing.

In order to achieve the possible benefit mentioned above, a ceramic electronic component according to the present disclosure includes a main body made of ceramic as a main material and having a first surface and a second surface facing each other, a dummy conductor disposed to cover at least a portion of an outer edge of a specific surface selected as at least one of the first surface and the second surface and electrically isolated therefrom, and land electrodes disposed on the second surface, and a ridge of an outer periphery of the specific surface of the main body is rounded.

According to the present disclosure, since the dummy conductor is disposed to cover at least a portion of the outer edge of the specific surface, the impact resistance can be improved, and thereby, the shell cracks can be prevented without increasing the amount of removal by barrel polishing.

DETAILED DESCRIPTION OF THE DISCLOSURE

Figure 1:
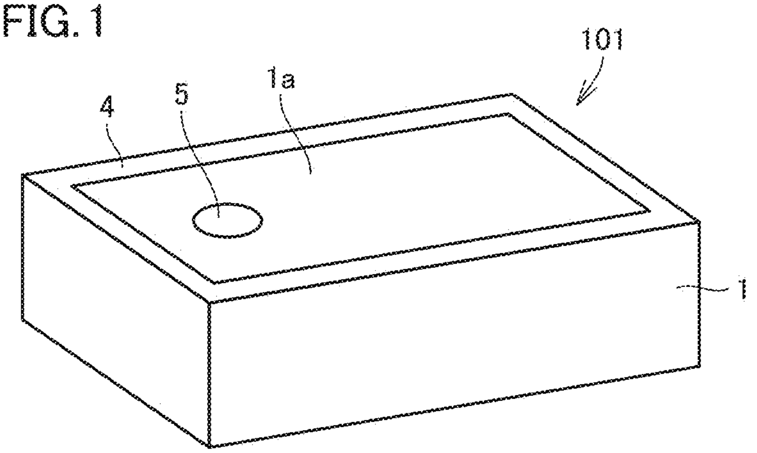
FIG. 1 is a first perspective view illustrating a ceramic electronic component according to a first embodiment of the present disclosure.

The dimensional ratio illustrated in the drawings do not necessarily and faithfully represent the actual dimension ratio, and the dimensional ratio may be modified for the convenience of description. In the following description, when referring to the concept of top or bottom, it does not necessarily mean absolute top or bottom, but may mean relative top or bottom in the illustrated posture.

First Embodiment

Figure 2:
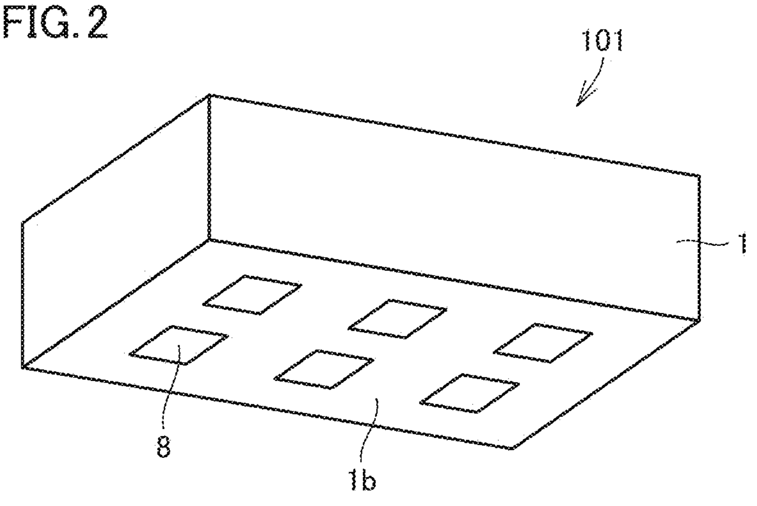
FIG. 2 is a second perspective view illustrating the ceramic electronic component according to the first embodiment of the present disclosure.

A ceramic electronic component according to a first embodiment of the present disclosure will be described with reference to FIGS. 1 to 4. FIG. 1 illustrates a ceramic electronic component 101 according to the present embodiment. The ceramic electronic component 101 includes a main body 1. The main body 1 has a first surface 1*a*. The first surface 1*a* is formed with a marking portion 5. FIG. 2 illustrates the ceramic electronic component 101 viewed obliquely from the bottom. The main body 1 has a second surface 1*b* opposite to the first surface 1*a*. A plurality of land electrodes 8 are disposed on the second surface 1*b*. In the present embodiment, six land electrodes 8 are disposed, but this is merely one example. The number of the land electrodes 8 disposed on the second surface 1*b* is not limited to six.

Figure 3:
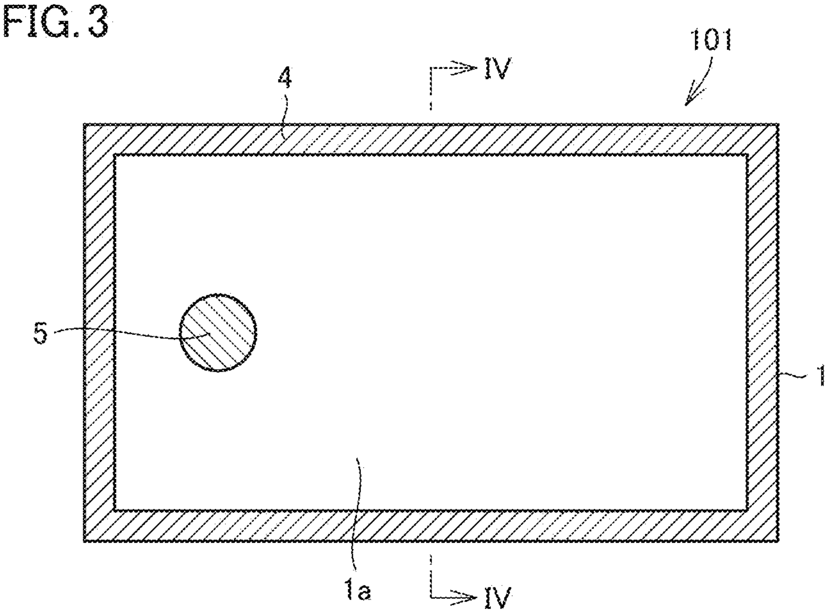
FIG. 3 is a plan view illustrating the ceramic electronic component according to the first embodiment of the present disclosure.
Figure 4:
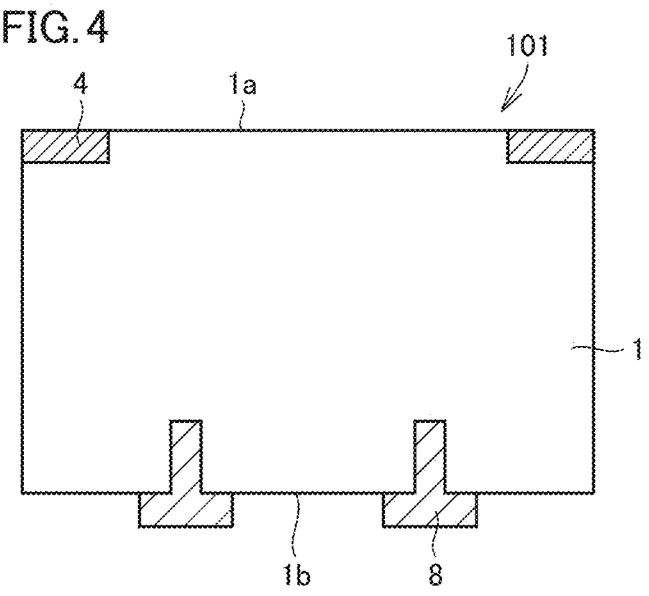
FIG. 4 is a cross-sectional view taken along line IV-IV in FIG. 3.

FIG. 3 is a plan view illustrating the ceramic electronic component 101. FIG. 4 is a cross-sectional view taken along line IV-IV in FIG. 3. In FIGS. 1 to 4, a ridge of the ceramic electronic component 101 is illustrated as having a right angle, but actually the ridge is rounded to some extent by barrel polishing.

The ceramic electronic component 101 includes a main body 1, a dummy conductor 4, and land electrodes 8. The main body 1 is mainly made of ceramic. The main body 1 has a first surface 1*a* and a second surface 1*b* facing each other. The dummy conductor 4 is disposed to cover at least a portion of an outer edge of a specific surface selected as at least one of the first surface 1*a* and the second surface 1*b*. The dummy conductor 4 is electrically isolated. The land electrodes 8 are disposed on the second surface 1*b*. A ridge of an outer periphery of the specific surface of the main body 1 is rounded.

In the present embodiment, since the dummy conductor 4 is disposed to cover at least a portion of the outer edge of the specific surface, the impact resistance can be improved. In other words, the shell cracks can be prevented without increasing the amount of removal by barrel polishing.

In the present embodiment, as an example, the first surface 1*a* is defined as the specific surface. Instead of the first surface 1*a*, the second surface 1*b* may be defined as the specific surface. In this case, both the dummy conductor 4 and the land electrodes 8 are disposed on the second surface 1*b*. Both the first surface 1*a* and the second surface 1*b* may be defined as the specific surface. When both the first surface 1*a* and the second surface 1*b* are defined as the specific surface, the dummy conductor 4 is disposed on the first surface 1*a*, and the dummy conductor 4 and the land electrodes 8 are disposed on the second surface 1*b*.

Second Embodiment

Figure 5:
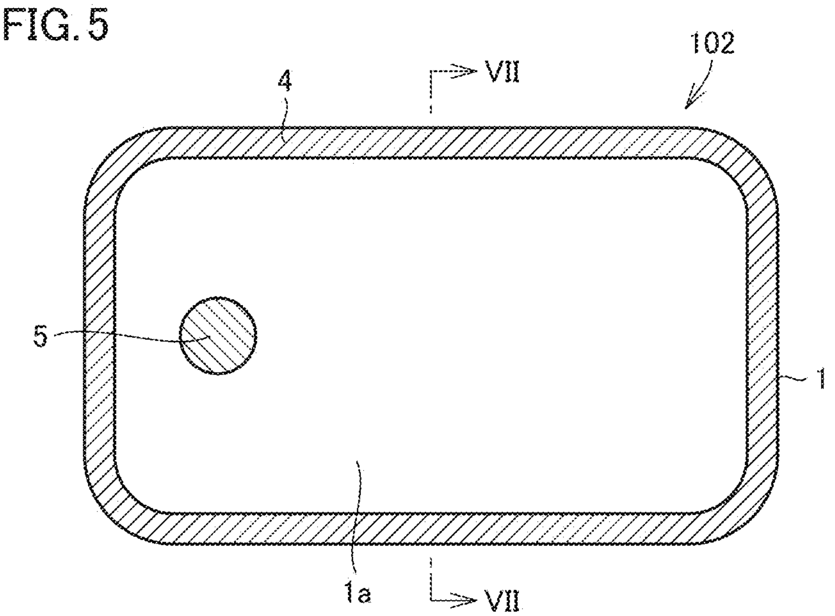
FIG. 5 is a plan view illustrating a ceramic electronic component according to a second embodiment of the present disclosure.
Figure 6:
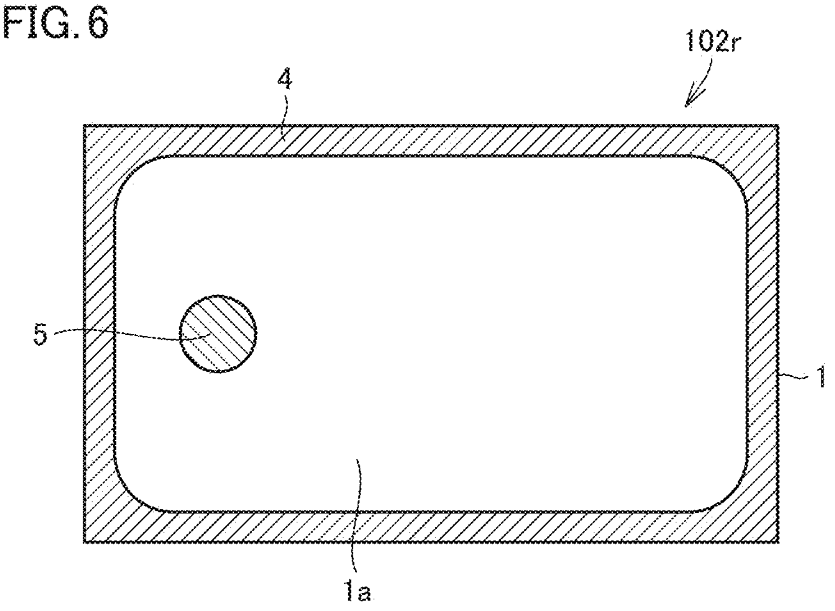
FIG. 6 is a plan view illustrating a raw material for preparing the ceramic electronic component according to the second embodiment of the present disclosure.
Figure 7:
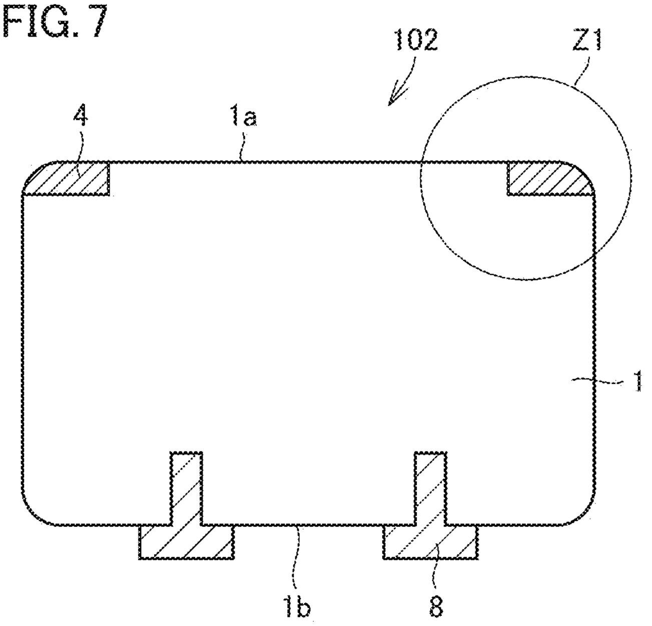
FIG. 7 is a cross-sectional view taken along line VII-VII in FIG. 5.
Figure 8:
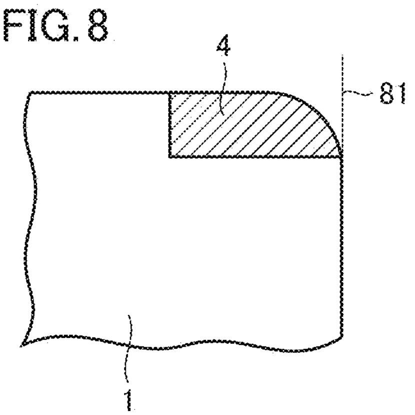
FIG. 8 is an enlarged view illustrating a portion Z1 in FIG. 7.

A ceramic electronic component according to a second embodiment of the present disclosure will be described with reference to FIGS. 5 to 8. FIG. 5 is a plan view illustrating a ceramic electronic component 102 according to the present embodiment. In the ceramic electronic component 102, the ridge is remarkably rounded. In order to obtain such a ceramic electronic component, firstly, a raw material 102*r* as illustrated in FIG. 6 may be prepared, and barrel polishing may be performed on the raw material. FIG. 7 is a cross-sectional view taken along line VII-VII in FIG. 5. FIG. 8 is an enlarged view illustrating a portion Z1 in FIG. 7. The edge of the dummy conductor 4 is rounded by barrel polishing. The dummy conductor 4 is tangent to a straight line 81 extending upward along a side surface of the main body 1. The upper surface of the main body 1 is flush with the upper surface of the dummy conductor 4. The configuration of the other portions is the same as that described in the first embodiment, and the description thereof will not be repeated.

Also in the present embodiment, the same effects as those described in the first embodiment can be obtained.

Third Embodiment

Figure 9:
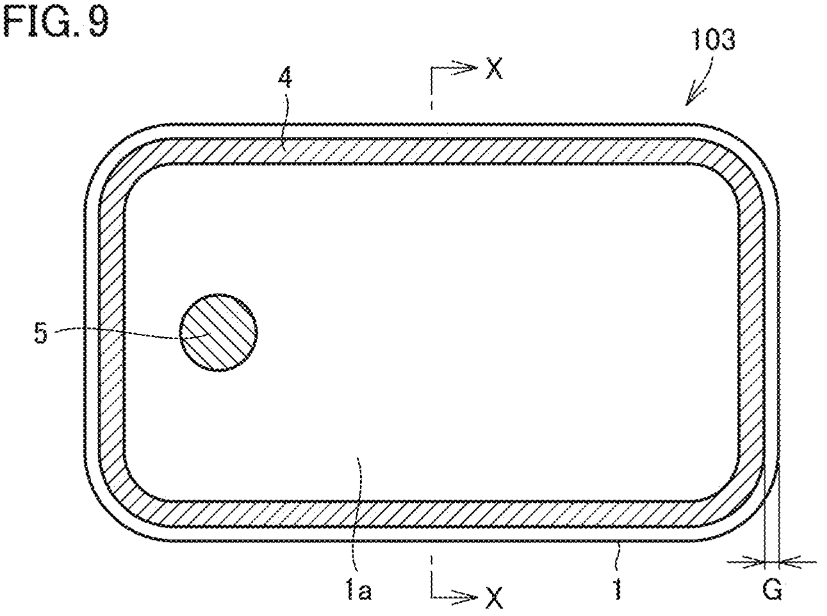
FIG. 9 is a plan view illustrating a ceramic electronic component according to a third embodiment of the present disclosure.
Figure 10:
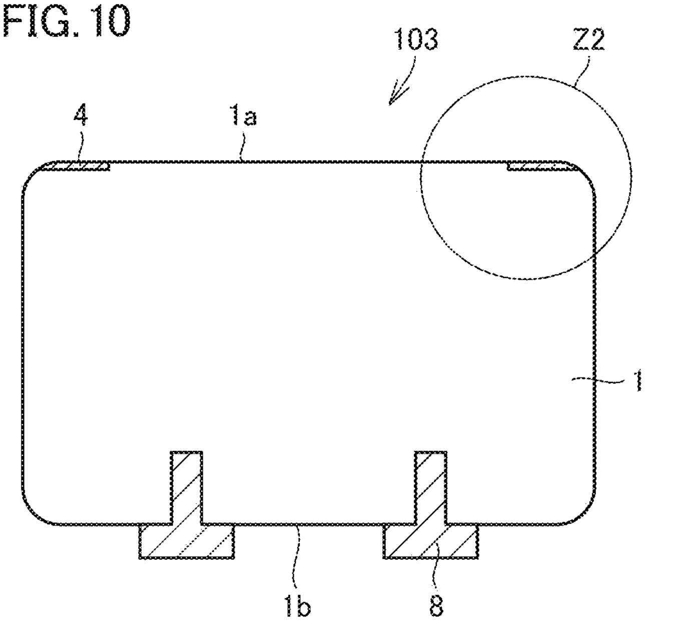
FIG. 10 is a cross-sectional view taken along line X-X in FIG. 9.
Figure 11:
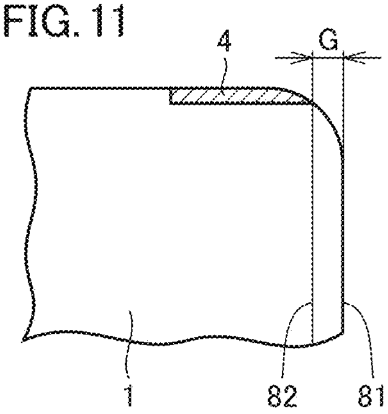
FIG. 11 is an enlarged view illustrating a portion Z2 in FIG. 10.

A ceramic electronic component according to a third embodiment of the present disclosure will be described with reference to FIGS. 9 to 11. FIG. 9 is a plan view illustrating a ceramic electronic component 103 according to the present embodiment. In the ceramic electronic component 103, since the ridge has been rounded by barrel polishing, a ceramic portion of the main body 1 with a width G is located outside the dummy conductor 4 in a plan view. FIG. 10 is a cross-sectional view taken along line X-X in FIG. 9. FIG. 11 is an enlarged view illustrating a portion Z2 in FIG. 10. The distance between a straight line 81 extending upward from a side surface of the main body 1 and a straight line 82 extending in the vertical direction from an edge of the dummy conductor 4 is G. In this case, the entire rounded portion in the vicinity of the ridge is not covered with the dummy conductor 4, but the edge of the first surface 1*a* is covered with the dummy conductor 4. The first surface 1*a* is a flat surface. The first surface 1*a* does not include any portion that is lowered by the rounded portion. The configuration of the other portions is the same as that described in the first embodiment, and the description thereof will not be repeated.

Also in the present embodiment, the same effects as those described in the first embodiment can be obtained.

Fourth Embodiment

Figure 12:
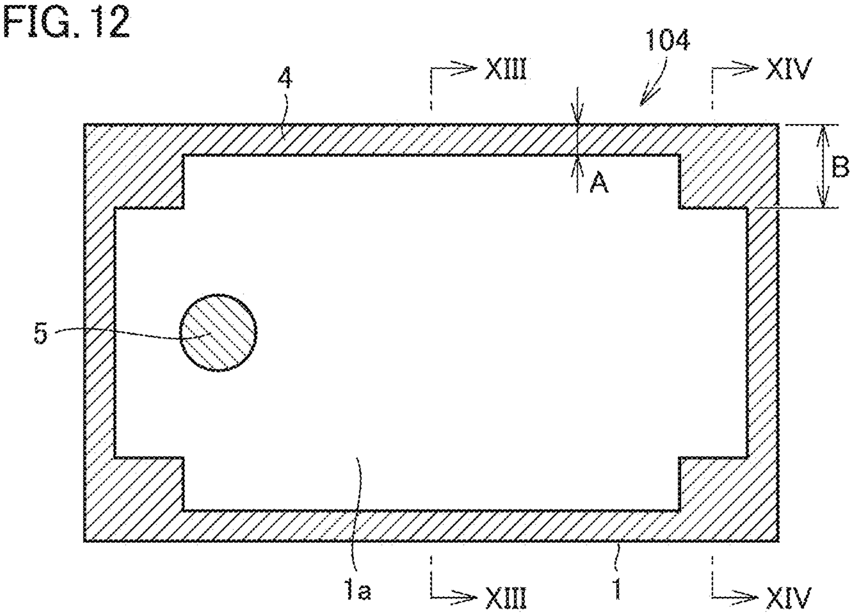
FIG. 12 is a plan view illustrating a ceramic electronic component according to a fourth embodiment of the present disclosure.
Figure 13:
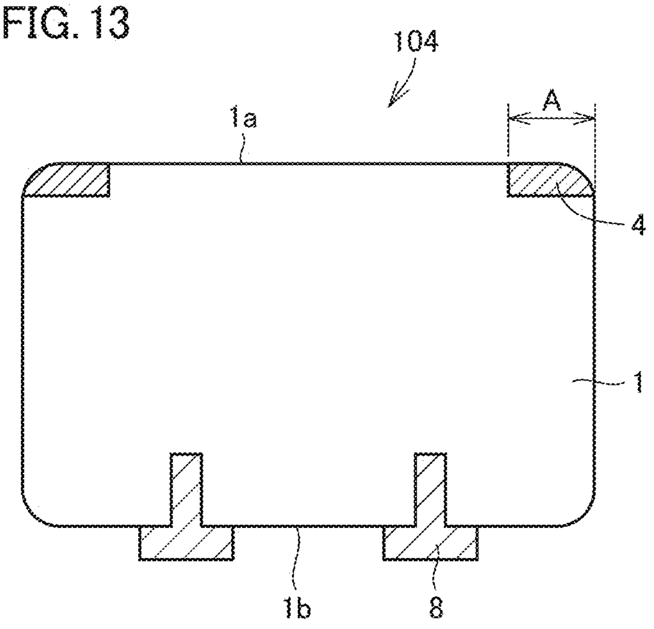
FIG. 13 is a cross-sectional view taken along line XIII-XIII in FIG. 12.
Figure 14:
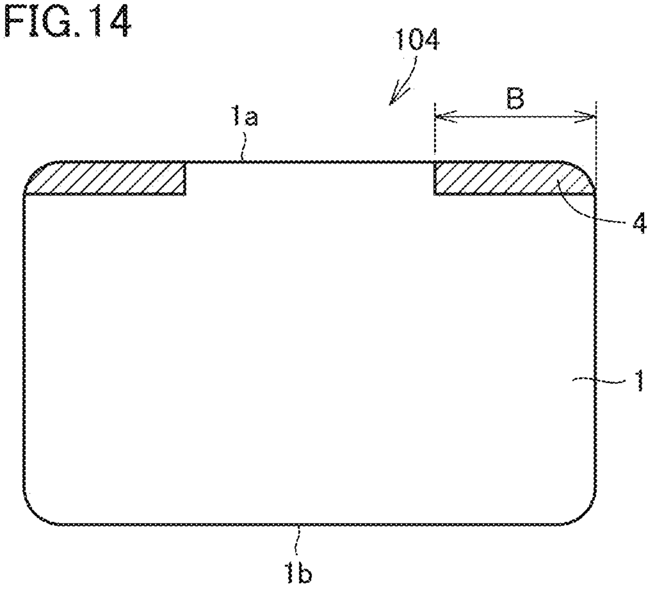
FIG. 14 is a cross-sectional view taken along line XIV-XIV in FIG. 12.

A ceramic electronic component according to a fourth embodiment of the present disclosure will be described with reference to FIGS. 12 to 14. FIG. 12 is a plan view illustrating a ceramic electronic component 104 according to the present embodiment. FIG. 13 is a cross-sectional view taken along line XIII-XIII in FIG. 12. FIG. 14 is a cross-sectional view taken along line XIV-XIV in FIG. 12.

In the ceramic electronic component 104, the dummy conductor 4 includes a linear portion which extends along at least a portion of the outer edge of the specific surface. The linear portion includes a first portion which is a portion of the outer edge of the specific surface and is wider than the other portion. In other words, when the width of the first portion of the linear portion of the dummy conductor 4 is denoted by B and the width of another portion other than the first portion is denoted by A, A<B. In the present embodiment, the first portion is a corner. The configuration of the other portions is the same as that described in the first embodiment, and the description thereof will not be repeated.

Also in the present embodiment, the same effects as those described in the first embodiment can be obtained. Further, in the present embodiment, since the first portion of the linear portion of the dummy conductor 4 is wider, the impact resistance of the first portion is increased, which effectively prevents the occurrence of shell cracks.

As described in the present embodiment, the dummy conductor 4 is preferably annular and surrounds the specific surface. Since the dummy conductor 4 surrounds the specific surface, the specific surface can withstand impact from various directions.

As described in the present embodiment, the first portion is preferably a corner of the specific surface. Although the corner is particularly susceptible to impact and is susceptible to shell cracking, since the width of the corner of the dummy conductor 4 is locally increased, the impact resistance of the corner is increased, which effectively prevents the occurrence of shell cracks.

Fifth Embodiment

Figure 15:
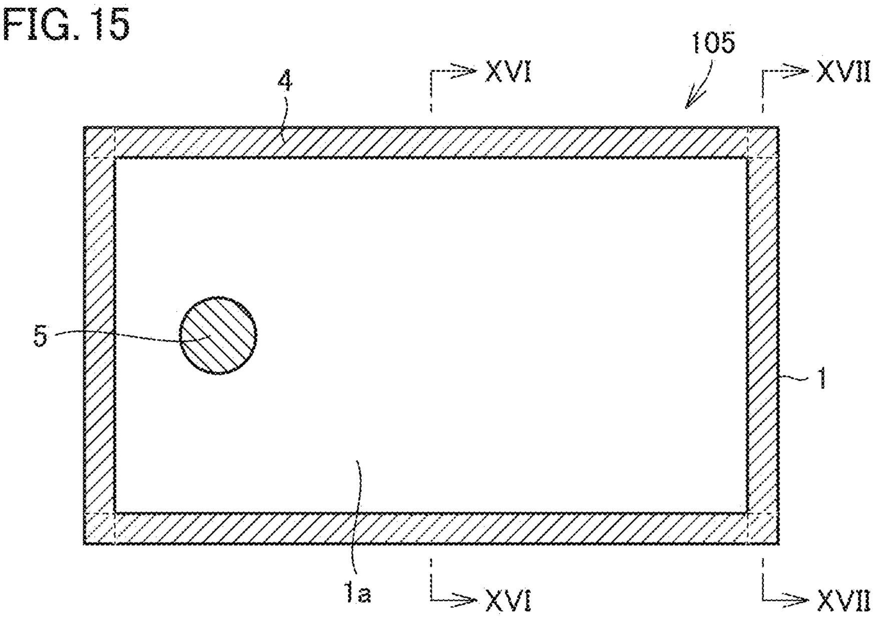
FIG. 15 is a plan view illustrating a ceramic electronic component according to a fifth embodiment of the present disclosure.
Figure 16:
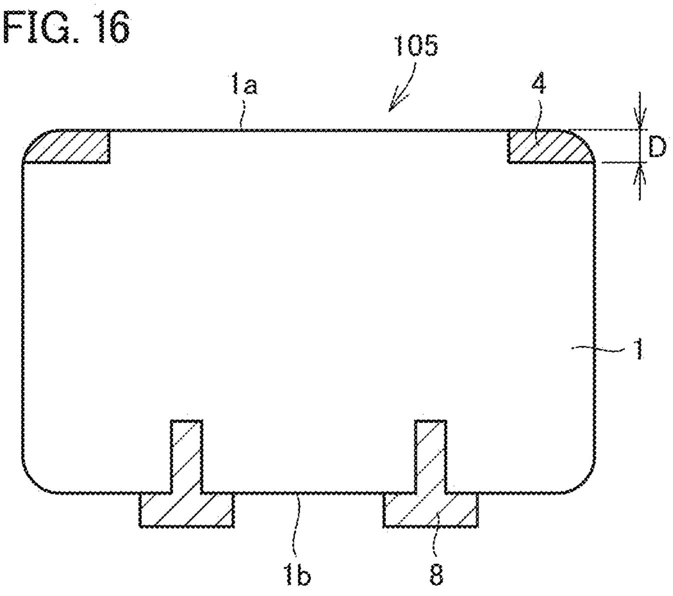
FIG. 16 is a cross-sectional view taken along line XVI-XVI in FIG. 15.
Figure 17:
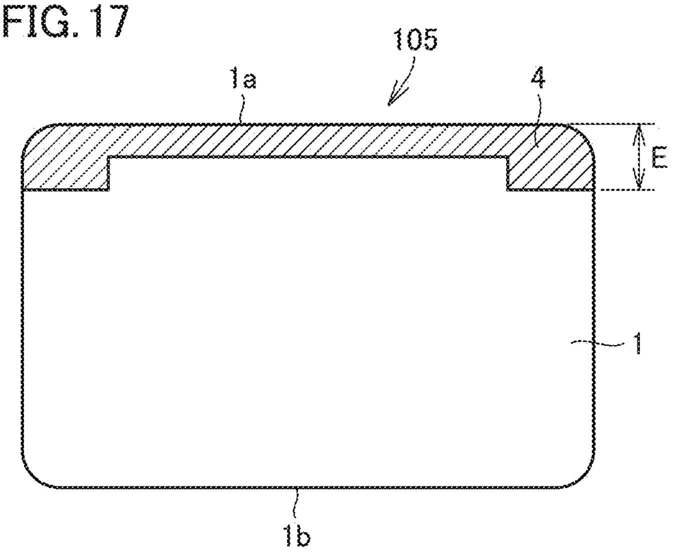
FIG. 17 is a cross-sectional view taken along line XVII-XVII in FIG. 15.

A ceramic electronic component according to a fifth embodiment of the present disclosure will be described with reference to FIGS. 15 to 17. FIG. 15 is a plan view illustrating a ceramic electronic component 105 according to the present embodiment. FIG. 16 is a cross-sectional view taken along line XVI-XVI in FIG. 15. FIG. 17 is a cross-sectional view taken along line XVII-XVII in FIG. 15.

In the ceramic electronic component 105, the dummy conductor 4 includes a linear portion which extends along at least a portion of the outer edge of the specific surface, and the linear portion includes a second portion which is a portion of the outer edge of the specific surface and is thicker than the other portion. In other words, when the thickness of the second portion of the linear portion of the dummy conductor 4 is denoted by E and the thickness of another portion other than the second portion is denoted by D, D<E.

In the present embodiment, the second portion is a corner. The configuration of the other portions is the same as that described in the first embodiment, and the description thereof will not be repeated.

Also in the present embodiment, the same effects as those described in the first embodiment can be obtained. Further, in the present embodiment, since the second portion of the linear portion of the dummy conductor 4 is thicker, the impact resistance of the second portion is increased, which effectively prevents the occurrence of shell cracks.

As described in the present embodiment, the second portion is preferably a corner of the specific surface. Although the corner is particularly susceptible to impact and is susceptible to shell cracking, since the width of the corner of the dummy conductor 4 is locally increased, the impact resistance of the corner is increased, which effectively prevents the occurrence of shell cracks.

Sixth Embodiment

Figure 18:
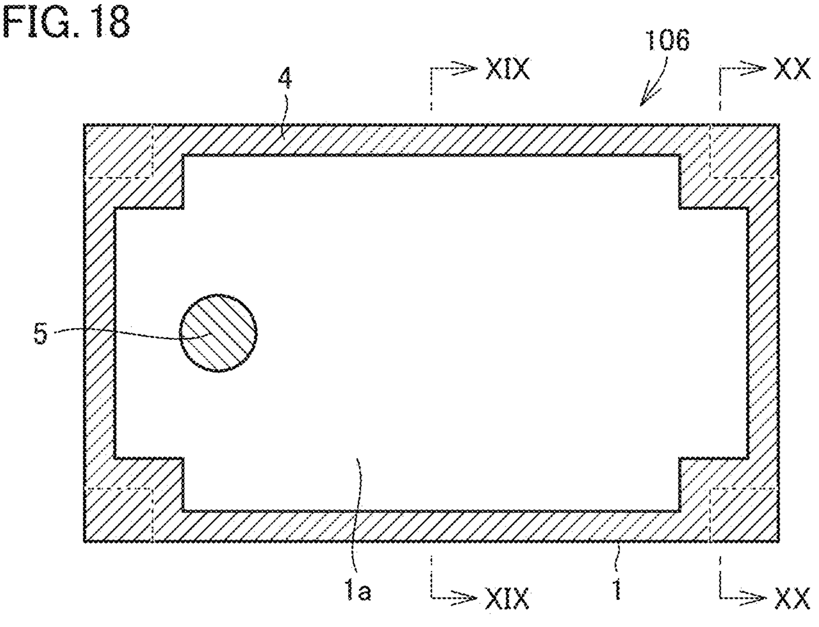
FIG. 18 is a plan view illustrating a ceramic electronic component according to a sixth embodiment of the present disclosure.
Figure 19:
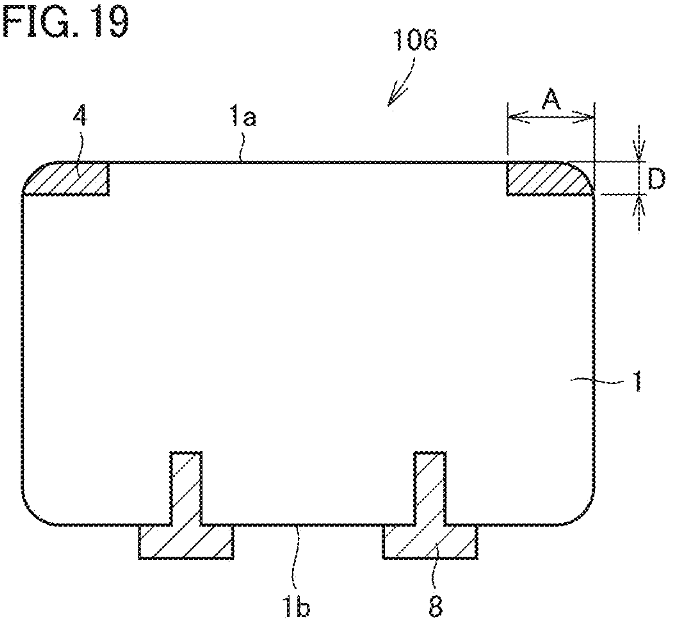
FIG. 19 is a cross-sectional view taken along line XIX-XIX in FIG. 18.
Figure 20:
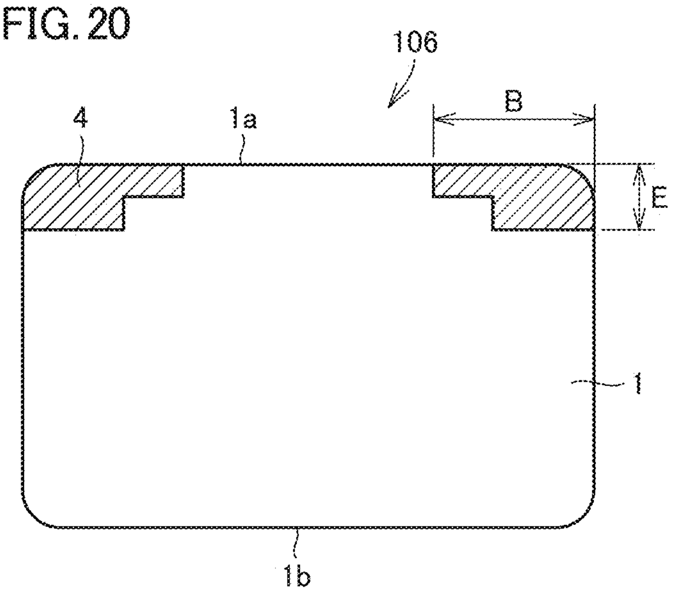
FIG. 20 is a cross-sectional view taken along line XX-XX in FIG. 18.

A ceramic electronic component according to a sixth embodiment of the present disclosure will be described with reference to FIGS. 18 to 20. FIG. 18 is a plan view illustrating a ceramic electronic component 106 according to the present embodiment. FIG. 19 is a cross-sectional view taken along line XIX-XIX in FIG. 18. FIG. 20 is a cross-sectional view taken along line XX-XX in FIG. 18.

In the ceramic electronic component 106, a portion with a width B is provided at a corner of the linear portion of the dummy conductor 4. The width of another portion other than the portion with the width B is denoted by A, and A<B. Further, in the corner, the thickness of a part of the portion with the width B is denoted by E. The thickness of the other portion is denoted by D, and D<E.

Also in the present embodiment, the same effects as those described in the first embodiment can be obtained. Furthermore, since a portion having a locally increased width and a portion having a locally increased thickness are provided at the corner of the linear portion of the dummy conductor 4, the impact resistance is increased, which effectively prevents the occurrence of shell cracks.

Seventh Embodiment

Figure 21:
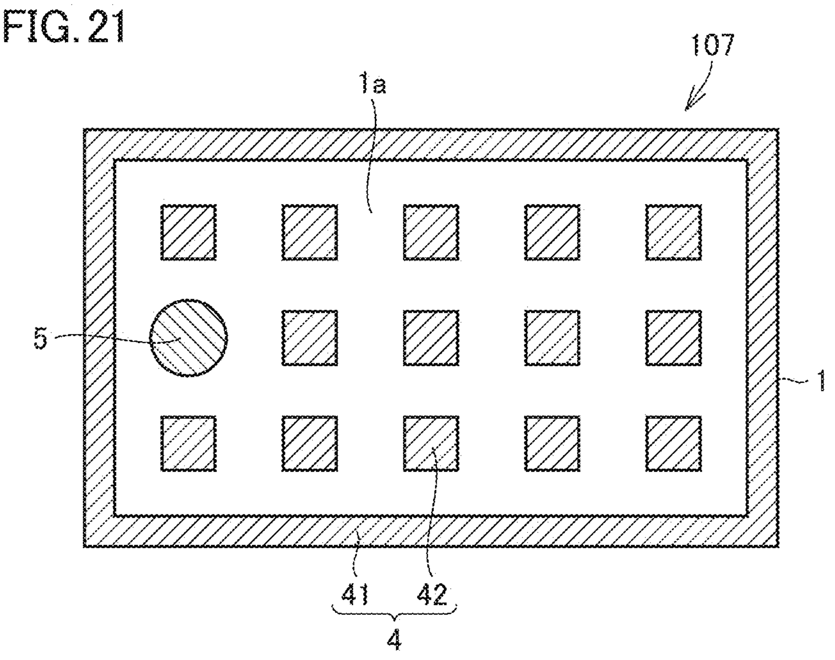
FIG. 21 is a plan view illustrating a ceramic electronic component according to a seventh embodiment of the present disclosure.

A ceramic electronic component according to a seventh embodiment of the present disclosure will be described with reference to FIG. 21. FIG. 21 is a plan view illustrating a ceramic electronic component 107 according to the present embodiment.

In the ceramic electronic component 107, the dummy conductor 4 includes an island portion 42 which is spaced apart from the outer edge of the specific surface and is disposed on the specific surface. The dummy conductor 4 includes an annular portion 41 and an island portion 42. The island portion 42 includes a plurality of square conductor patterns. In the present embodiment, the plurality of conductor patterns (the island portion 42) are arranged substantially in a matrix. The first surface 1*a* is also formed with a marking portion 5. The marking portion 5 and the island portion 42 have different shapes and are visually distinguishable from each other. The configuration of the other portions is the same as that described in the first embodiment, and the description thereof will not be repeated.

Also in the present embodiment, the same effects as those described in the first embodiment can be obtained. Further, in the present embodiment, in addition to the fact that the outer edge is protected by the annular portion 41, the inner portion thereof is protected by the island portion 42, and thereby it is possible to more reliably prevent the occurrence of shell cracks.

In the present embodiment, the conductor pattern of each island portion 42 has a square shape, but this is merely an example, and the conductor pattern may have any shape other than a square shape. The visual difference for distinguishing the marking portion 5 and the island portion 42 is not limited to a difference in shape, and may be, for example, a difference in material, a difference in color, or a difference in size.

Eighth Embodiment

Figure 22:
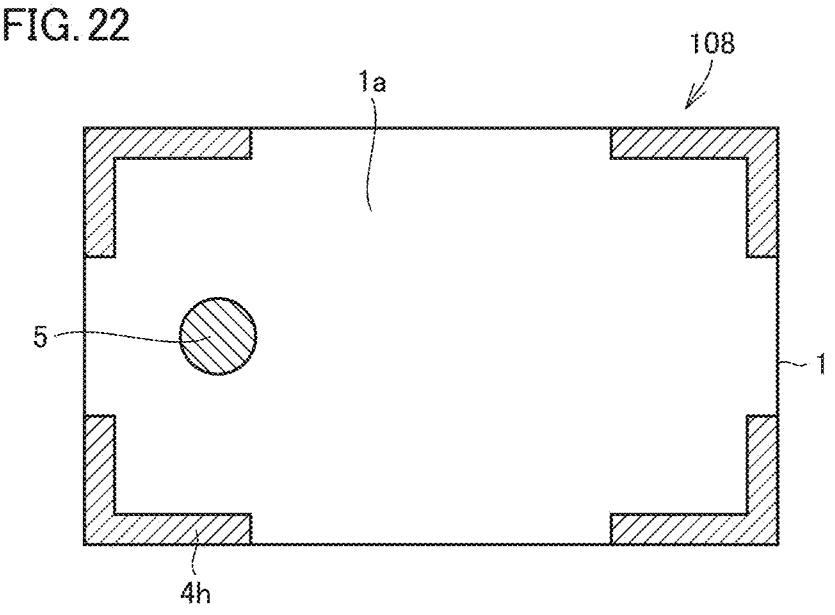
FIG. 22 is a plan view illustrating a ceramic electronic component according to an eighth embodiment of the present disclosure.

A ceramic electronic component according to an eighth embodiment of the present disclosure will be described with reference to FIG. 22. FIG. 22 is a plan view illustrating a ceramic electronic component 108 according to the present embodiment.

The ceramic electronic component 108 includes a dummy conductor 4*h*. The dummy conductor 4*h* is not annular. The dummy conductor 4*h* is disposed to cover a portion of the outer edge of the first surface 1*a*. In the present embodiment, the dummy conductor 4*h* is disposed to cover only corners of the outer edge of the first surface 1*a*, without covering a middle portion of each side. This is merely an example. The configuration of the other portions is the same as that described in the first embodiment, and the description thereof will not be repeated.

Also in the present embodiment, since the corner is protected by the dummy conductor 4*h,* the impact resistance can be improved. In other words, the shell cracks can be prevented without increasing the amount of removal by barrel polishing.

Figure 23:
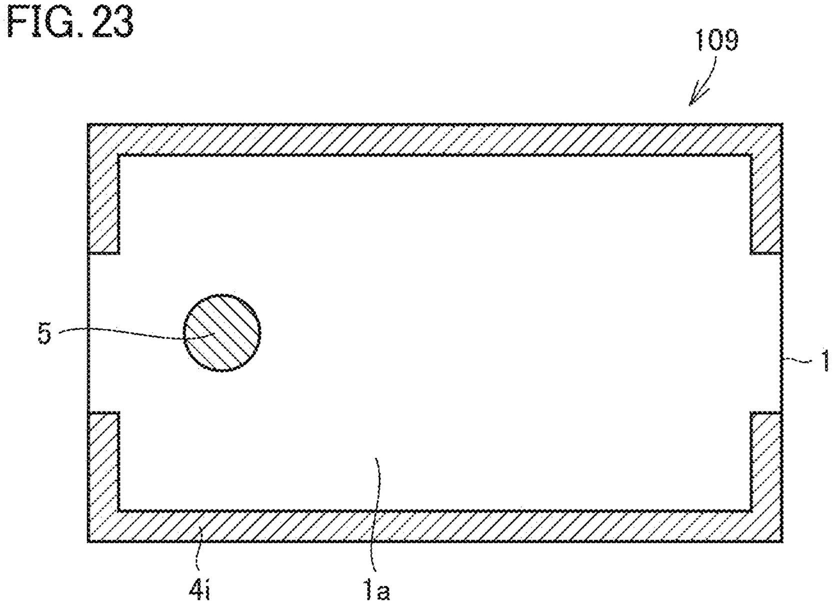
FIG. 23 is a plan view illustrating a first modification of the ceramic electronic component according to the eighth embodiment of the present disclosure.

As a first modification of the present embodiment, there is provided a ceramic electronic component 109 illustrated in FIG. 23. The ceramic electronic component 109 includes a dummy conductor 4*i*. The dummy conductor 4*i* completely covers the outer edge of the long side of the first surface 1*a*, but does not cover a middle portion of the short side. This is merely an example.

Figure 24:
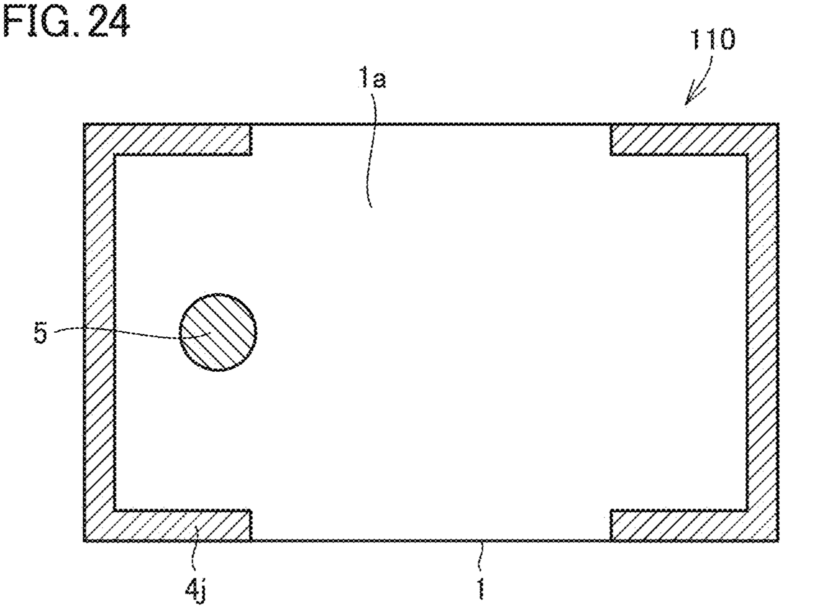
FIG. 24 is a plan view illustrating a second modification of the ceramic electronic component according to the eighth embodiment of the present disclosure.

As a second modification of the present embodiment, there is provided a ceramic electronic component 110 illustrated in FIG. 24. The ceramic electronic component 110 includes a dummy conductor 4*j*. The dummy conductor 4*j* completely covers the outer edge of the short side of the first surface 1*a*, but does not cover a middle portion of the long side. This is merely an example.

Figure 25:
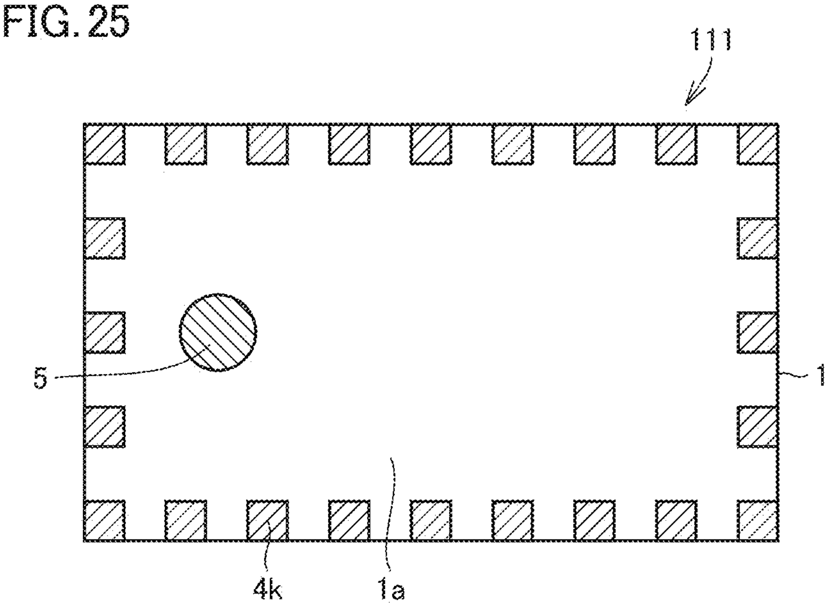
FIG. 25 is a plan view illustrating a third modification of the ceramic electronic component according to the eighth embodiment of the present disclosure.

As a third modification of the present embodiment, there is provided a ceramic electronic component 111 illustrated in FIG. 25. The ceramic electronic component 111 includes a dummy conductor 4*k*. The dummy conductors 4*k* are discontinuously disposed on the entire outer edge of the first surface 1*a*. In other words, the dummy conductor 4*k* includes a plurality of square conductor units, and these conductor units are disposed at substantially equal intervals along the outer edge of the first surface 1*a*. This is merely an example.

Ninth Embodiment

Figure 26:
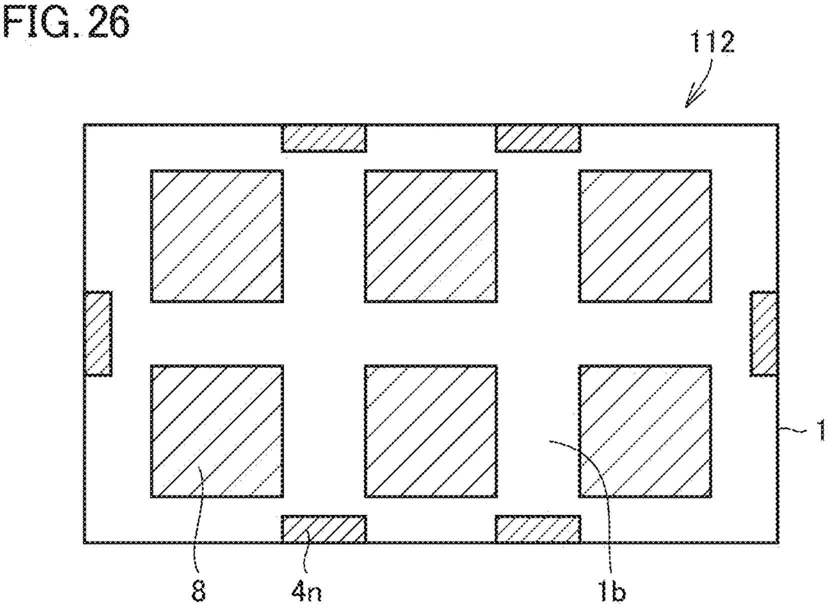
FIG. 26 is a bottom view illustrating a ceramic electronic component according to a ninth embodiment of the present disclosure.

A ceramic electronic component according to a ninth embodiment of the present disclosure will be described with reference to FIG. 26. FIG. 26 is a bottom view illustrating a ceramic electronic component 112 according to the present embodiment. FIG. 26 illustrates the second surface 1*b*.

A dummy conductor 4*n* is disposed to cover a portion of the outer edge of the second surface 1*b*. The dummy conductor 4*n* includes a plurality of short linear portions, and each of these linear portions is disposed at a position without overlapping with the land electrode 8. Specifically, each linear portion is disposed at a position without overlapping with a projection of the land electrode 8 projected on each side. The configuration of the other portions is the same as that described in the first embodiment, and the description thereof will not be repeated.

Also in the present embodiment, the same effects as those described in the first embodiment can be obtained. In the present embodiment, since the dummy conductor 4*n* is disposed at a position without overlapping with the land electrode 8, the risk of a short circuit due to the interference between the land electrode 8 and the dummy conductor 4*n* can be reduced.

Tenth Embodiment

Figure 27:
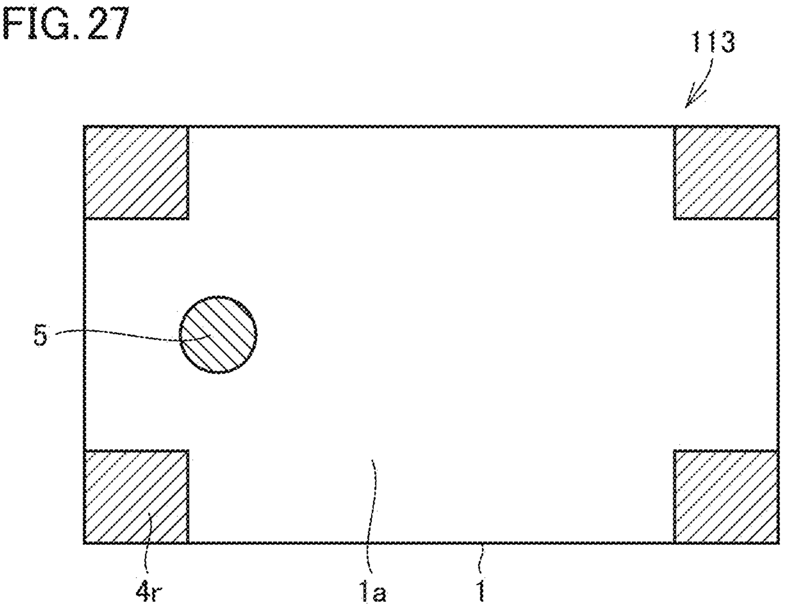
FIG. 27 is a plan view illustrating a ceramic electronic component according to a tenth embodiment of the present disclosure.

A ceramic electronic component according to a tenth embodiment of the present disclosure will be described with reference to FIG. 27. FIG. 27 is a plan view illustrating a ceramic electronic component 113 according to the present embodiment. The ceramic electronic component 113 includes a dummy conductor 4*r*. The dummy conductor 4*r* includes four square conductor units. Each of the four square conductor units is disposed at a corner of the first surface 1*a*. This is merely an example. The configuration of the other portions is the same as that described in the first embodiment, and the description thereof will not be repeated.

Also in the present embodiment, since each corner is protected by the dummy conductor 4*r*, the impact resistance can be improved. In other words, the shell cracks can be prevented without increasing the amount of removal by barrel polishing.

Figure 28:
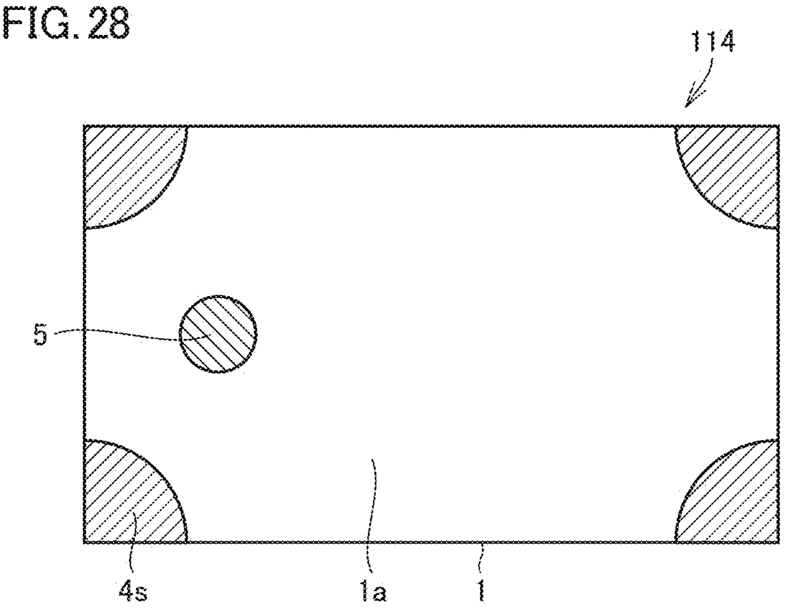
FIG. 28 is a plan view illustrating a modification of the ceramic electronic component according to the tenth embodiment of the present disclosure.

As a modification of the present embodiment, there is provided a ceramic electronic component 114 illustrated in FIG. 28. The ceramic electronic component 114 includes a dummy conductor 4*s*. The dummy conductor 4*s* includes four fan-shaped conductor units. Each of the four fan-shaped conductor units has a fan shape with a center angle of 90°. Each of the four fan-shaped conductor units is disposed at a corner of the first surface 1*a*. This is merely an example.

Eleventh Embodiment

Figure 29:
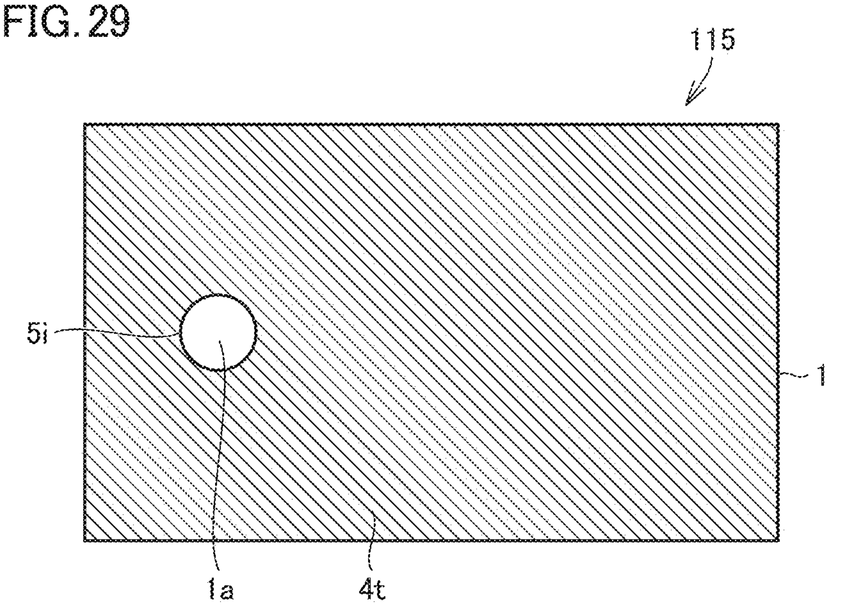
FIG. 29 is a plan view illustrating a ceramic electronic component according to an eleventh embodiment of the present disclosure.

A ceramic electronic component according to an eleventh embodiment of the present disclosure will be described with reference to FIG. 29. FIG. 29 is a plan view illustrating a ceramic electronic component 115 according to the present embodiment. The ceramic electronic component 115 includes a dummy conductor 4*t*.

The dummy conductor 4*t* covers the entire specific surface except for a part thereof which is opened as a marking portion 5*i*. In the present embodiment, since the first surface 1*a* is defined as the specific surface, the dummy conductor 4*t* covers the entire first surface 1*a* except for the part thereof which is opened as the marking portion 5*i*. Since the part thereof which is opened as the marking portion 5*i* is a small part of the first surface 1*a*, the dummy conductor 4*t* substantially covers the entire first surface 1*a*. The marking portion 5*i* is an opening of the dummy conductor 4*t*. The ceramic material of the main body 1 is visible from the marking portion 5*i*. The configuration of the other portions is the same as that described in the first embodiment, and the description thereof will not be repeated.

In the present embodiment, since most of the first surface 1*a* is covered with the dummy conductor 4*t*, the impact resistance can be significantly improved, and thereby the shell crack can be prevented. However, in the present embodiment, there is a possibility that the characteristics deteriorate due to electromagnetic interference between the conductor pattern built in the main body 1 and the dummy conductor 4*t*. Therefore, at the time of disposing the dummy conductor 4*t*, the electromagnetic interference with the conductor pattern built in the main body 1 should be thoroughly considered.

When a region of the first surface 1*a* other than the portion opened as the marking portion 5*i* is defined as a region X, the dummy conductor 4*t* does not necessarily completely cover the entire region X, and the dummy conductor 4*t* may substantially cover the entire region X. In other words, the configuration that "the dummy conductor 4*t* covers the entire specific surface except for a part thereof which is opened as the marking portion 5*i*" also includes a configuration that "the dummy conductor 4*t* substantially covers the entire specific surface except for a part thereof which is opened as the marking portion 5*i*".

Twelfth Embodiment

Figure 30:
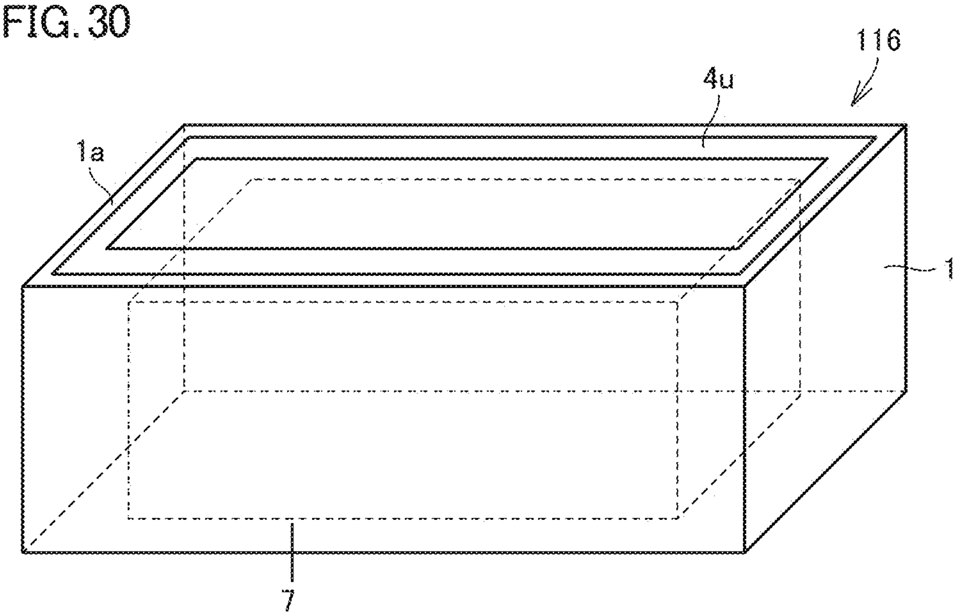
FIG. 30 is a perspective view illustrating a ceramic electronic component according to a twelfth embodiment of the present disclosure.
Figure 31:
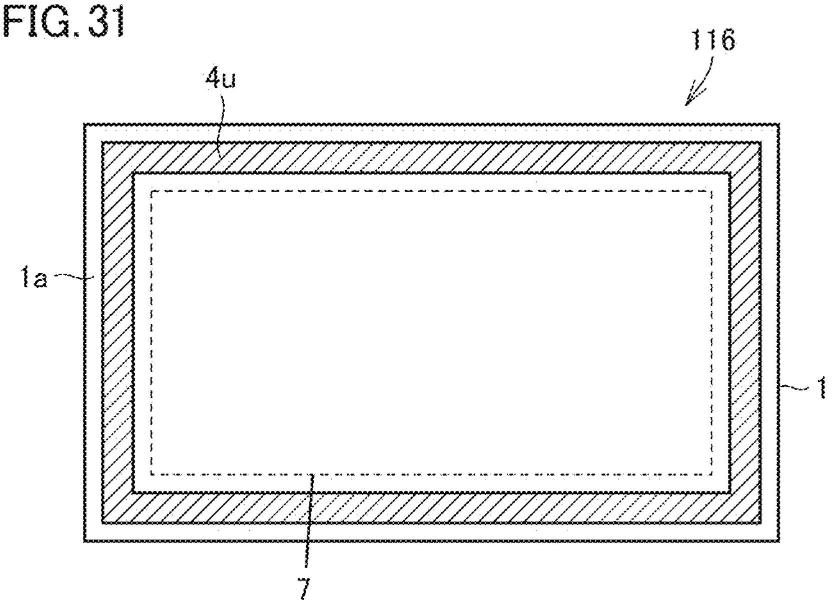
FIG. 31 is a plan view illustrating the ceramic electronic component according to the twelfth embodiment of the present disclosure.

A ceramic electronic component according to a twelfth embodiment of the present disclosure will be described with reference to FIGS. 30 to 31. FIG. 30 is a perspective view illustrating a ceramic electronic component 116 according to the present embodiment. FIG. 31 is a plan view illustrating the ceramic electronic component 116.

The ceramic electronic component 116 includes a dummy conductor 4*u*. In the ceramic electronic component 116, an internal electrode is disposed inside the main body 1 only in a partial region of the main body 1 when the main body 1 is viewed in a plan view. A region where an internal electrode is disposed in a plan view is referred to as a "design region". In FIG. 30, the design region 7 defined inside the main body 1 is indicated by a broken line. As illustrated in FIG. 31, the dummy conductor 4*u* is disposed only outside the design region 7 in a plan view. In FIGS. 30 and 31, the ridge of each side of the ceramic electronic component 116 is illustrated as having a right angle, but actually the ridge is rounded. At least the ridge of an outer periphery of the first surface 1*a* is rounded. The configuration of the other portions is the same as that described in the first embodiment, and the description thereof will not be repeated.

Also in the present embodiment, since the outer edge of the first surface 1*a* is protected by the dummy conductor 4*u*, the impact resistance can be improved. In other words, the shell cracks can be prevented without increasing the amount of removal by barrel polishing.

Further, in the present embodiment, since the dummy conductor 4*u* is disposed only outside the design region 7 in a plan view, it is possible to prevent the characteristics from being deteriorated by the electromagnetic interference between the dummy conductor and the conductor pattern built inside the main body 1.

Thirteenth Embodiment

Figure 32:
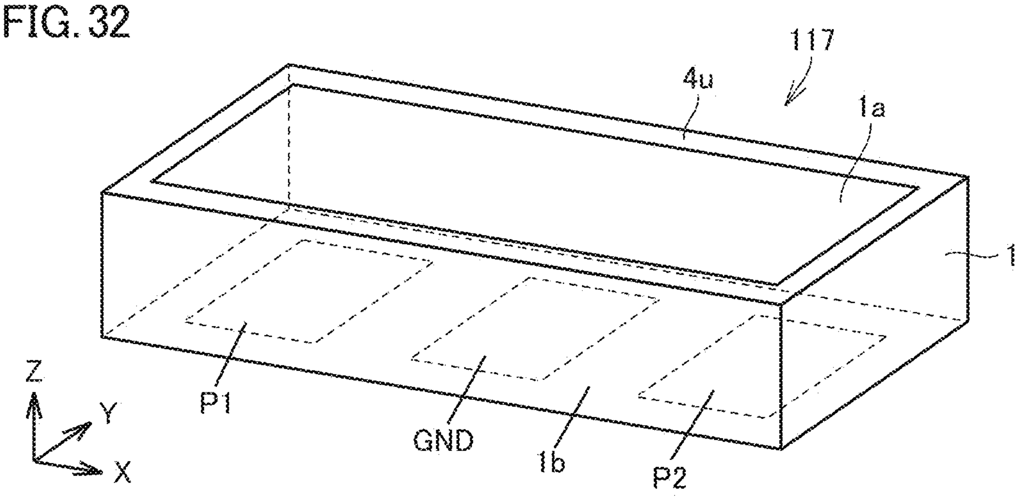
FIG. 32 is a perspective view illustrating a ceramic electronic component according to a thirteenth embodiment of the present disclosure.

A ceramic electronic component according to a thirteenth embodiment of the present disclosure will be described with reference to FIGS. 32 to 34. FIG. 32 is a perspective view illustrating a ceramic electronic component 117 according to the present embodiment. The ceramic electronic component 117 is a low-pass filter. In the present embodiment, the configuration of the ceramic electronic component when it is used as a low-pass filter will be described in more detail.

The ceramic electronic component 117 includes input/output terminals P1 and P2 and a ground electrode GND as the land electrodes disposed on the second surface 1*b* of the main body 1. In the ceramic electronic component 117, a ceramic layer is used as the dielectric layer. The main body 1 of the ceramic electronic component 117 is a stacked body of a plurality of ceramic layers, and a conductor pattern is disposed in each ceramic layer. An exploded view of the ceramic electronic component is illustrated in FIG. 33. FIG. 33 is an exploded view of the ceramic electronic component prior to barrel polishing. Actually, since barrel polishing is performed after the plurality of ceramic layers are stacked and integrated, the ridge becomes round. FIG. 34 illustrates the positional relationship of the layers when the ceramic electronic component 117 which is used as the low-pass filter is viewed from the front surface in FIG. 32.

Figure 33:
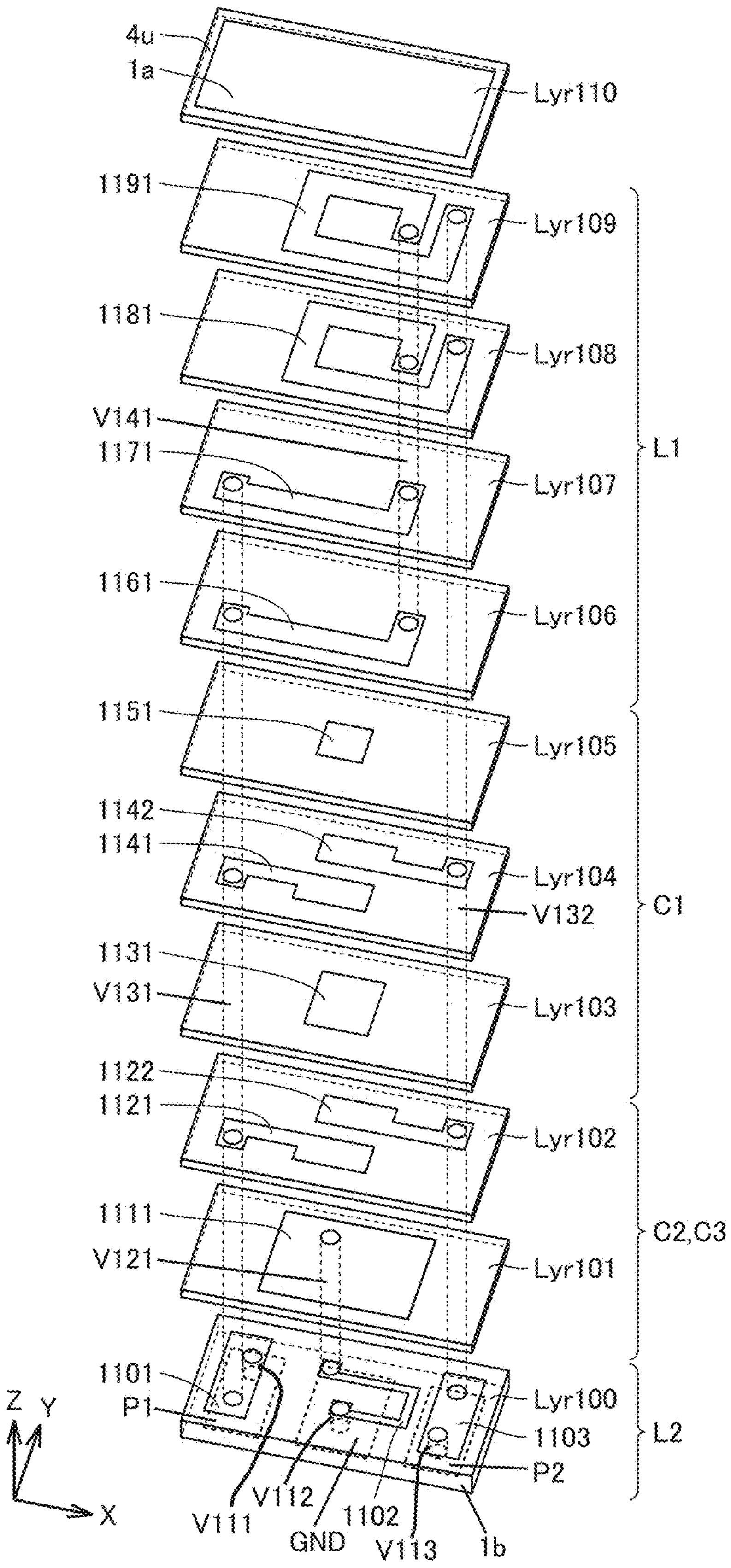
FIG. 33 is an exploded view illustrating the ceramic electronic component according to the thirteenth embodiment of the present disclosure.

As illustrated in FIG. 33, the ceramic electronic component 117 includes a plurality of ceramic layers Lyr100 to Lyr110. The plurality of ceramic layers are stacked in this order in the Z-axis direction with the ceramic layer Lyr100 as the second surface 1*b* and the ceramic layer Lyr110 as the first surface 1*a*. Line electrodes 1101 to 1103 are formed on the ceramic layer Lyr100. The line electrode 1101 is connected to the input/output terminal P1 through a via electrode V111. The line electrode 1102 is connected to the ground electrode GND through a via electrode V112. The line electrode 1103 is connected to the input/output terminal P2 through a via electrode V113. The line electrode 1102 constitutes a second inductor L2.

A capacitor electrode 1111 is formed on the ceramic layer Lyr101. The capacitor electrode 1111 is connected to the line electrode 1102 through a via electrode V121. A capacitor electrode 1121 and a capacitor electrode 1122 are formed on the ceramic layer Lyr102. The capacitor electrode 1121 is connected to the line electrode 1101 through a via electrode V131. The capacitor electrode 1122 is connected to the line electrode 1103 through a via electrode V132. The capacitor electrode 1111 and the capacitor electrode 1121 constitute a second capacitor C2. The capacitor electrode 1111 and the capacitor electrode 1122 constitute a third capacitor C3.

A capacitor electrode 1131 is formed on the ceramic layer Lyr103. A capacitor electrode 1141 and a capacitor electrode 1142 are formed on the ceramic layer Lyr104. The capacitor electrode 1141 is connected to the capacitor electrode 1121 through the via electrode V131. The capacitor electrode 1142 is connected to the capacitor electrode 1122 through the via electrode V132. A capacitor electrode 1151 is formed on the ceramic layer Lyr105. The capacitor electrodes 1131, 1141, 1142 and 1151 constitute a first capacitor C1.

A line electrode 1161 is formed on the ceramic layer Lyr106. The line electrode 1161 is connected to the capacitor electrode 1141 through the via electrode V131. A line electrode 1171 is formed on the ceramic layer Lyr107. The line electrode 1171 is connected to the line electrode 1161 through the via electrode V131 and a via electrode V141. A line electrode 1181 is formed on the ceramic layer Lyr108. The line electrode 1181 is connected to the line electrode 1171 through the via electrode V141. The line electrode 1181 is connected to the capacitor electrode 1142 through the via electrode V132. A line electrode 1191 is formed on the ceramic layer Lyr109. The line electrode 1191 is connected to the line electrode 1181 through the via electrodes V141 and V132. The line electrode 1161, 1171, 1181 and 1191 constitute a first inductor L1.

The line electrodes 1161 and 1171 included in the first inductor L1 have the same shape and partially overlap with each other in the stacking direction. The same applies to the line electrodes 1181 and 1191 included in the first inductor L1. Such a shape and arrangement increase the volume or cross-sectional area through which a current flows. Furthermore, the magnetic flux generated from the first inductor L1 is increased, which increases the effective inductance of the LC parallel resonator. As a result, the Q value of the ceramic electronic component 117 as a low-pass filter can be improved.

When the first inductor L1 and the second inductor L2 are formed as layers close to each other, the first inductor L1 and the second inductor L2 may be magnetically coupled to each other, resulting in a mutual inductance in addition to the inductance of the first inductor L1 and the inductance of the second inductor L2. As a result, the difference between the characteristics assumed from the circuit diagram of the low-pass filter designed to obtain the desired characteristics and the characteristics of the low-pass filter having the stacked structure illustrated in FIG. 33 may become larger than an expected value. When the difference becomes large, for example, an additional inductor or capacitor is required to ensure impedance matching or attenuation. This may increase the size of the low-pass filter or the manufacturing cost thereof.

Therefore, in the present embodiment, the layers on which the first to third capacitors C1 to C3 are formed are disposed between the layers on which the first inductor L1 is formed and the layer on which the second inductor L2 is formed. With such an arrangement, the first inductor L1 and the second inductor L2 can be spaced apart from each other. This can prevent magnetic coupling between the first inductor L1 and the second inductor L2. As a result, it is possible to prevent the characteristics such as the impedance characteristics or attenuation characteristics from being deviated from the desired characteristics without the necessity of adding any inductor or coil.

Figure 34:
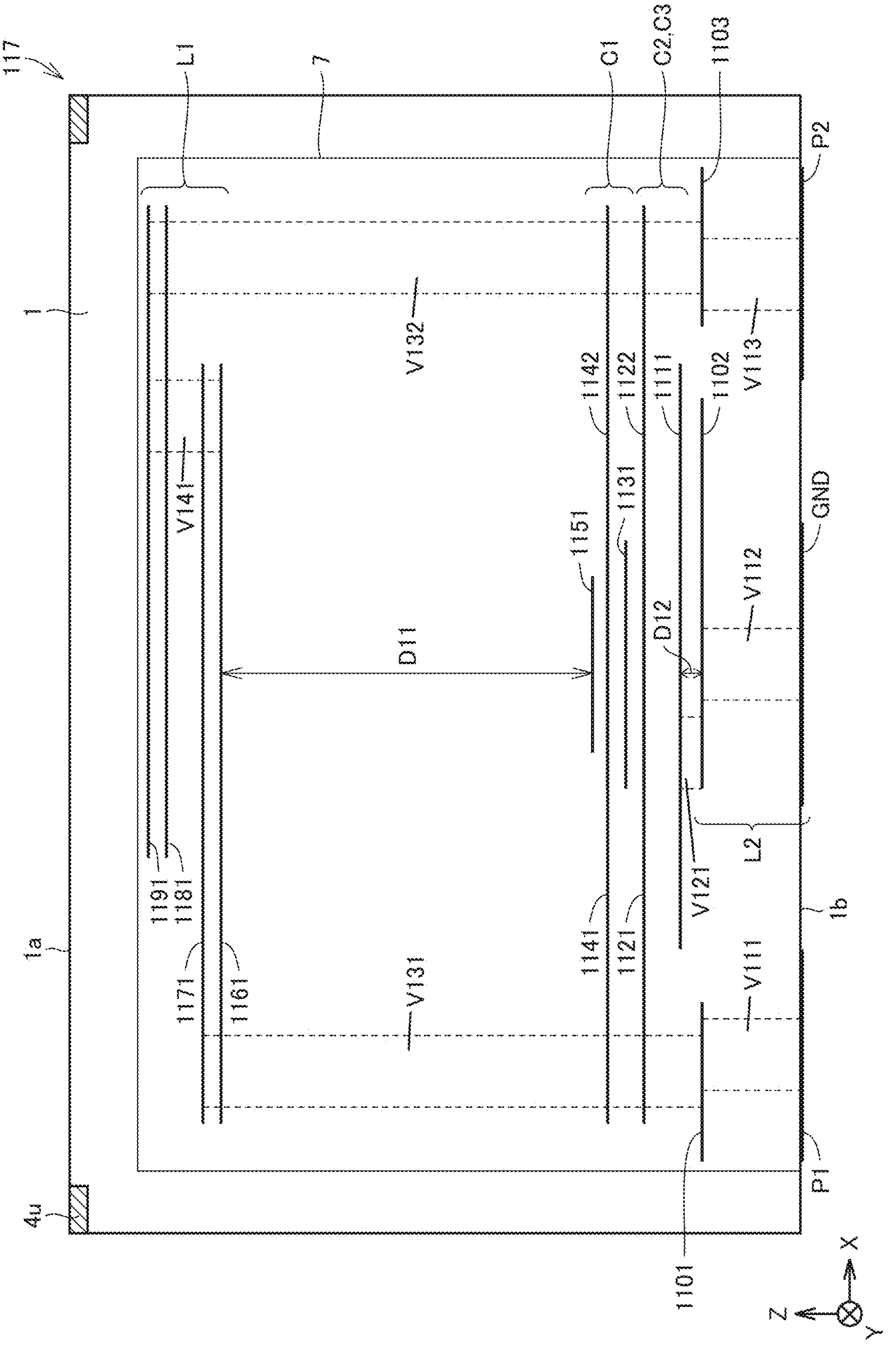
FIG. 34 is an explanatory diagram illustrating the positional relationship between layers of the ceramic electronic component according to the thirteenth embodiment of the present disclosure.

As illustrated in FIG. 34, all of the internal conductor patterns constituting each capacitor or inductor are disposed inside the design region 7. The dummy conductor 4*u* is disposed outside a region where the design region 7 is projected onto the first surface 1*a*. In FIG. 32 and FIG. 34, the ridge of each side of the ceramic electronic component 116 is illustrated as having a right angle, but actually barrel polishing is performed thereon, and the ridge is rounded.

Also in the present embodiment, the same effects as those described in the twelfth embodiment can be obtained.

In all of the embodiments mentioned above, the dummy conductor is not exposed and may be further plated. In other words, each dummy conductor may be covered with a plating film.

The embodiments described above may be appropriately combined. The embodiments disclosed herein are illustrative and non-restrictive in all respects. The scope of the present disclosure is defined by the claims, and includes any modifications within the scope and meaning equivalent to the claims.

Aspect 1

A ceramic electronic component including: a main body made of ceramic as a main material and having a first surface and a second surface facing each other; a dummy conductor disposed to cover at least a portion of an outer edge of a specific surface selected as at least one of the first surface and the second surface and electrically isolated therefrom; and land electrodes disposed on the second surface, a ridge of an outer periphery of the specific surface of the main body is rounded.

Aspect 2

The ceramic electronic component according to Aspect 1, wherein the dummy conductor includes a linear portion which extends along at least a portion of the outer edge of the specific surface, and the linear portion includes a first portion which is a portion of the outer edge of the specific surface and is wider than the other portion.

Aspect 3

The ceramic electronic component according to Aspect 2, wherein the first portion is a corner of the specific surface.

Aspect 4

The ceramic electronic component according to Aspect 1, wherein the dummy conductor includes a linear portion which extends along at least a portion of the outer edge of the specific surface, and the linear portion includes a second portion which is a portion of the outer edge of the specific surface and is thicker than the other portion.

Aspect 5

The ceramic electronic component according to Aspect 4, wherein the second portion is a corner of the specific surface.

Aspect 6

The ceramic electronic component according to any one of Aspects 1 to 5, wherein the dummy conductor is annular and surrounds the specific surface.

Aspect 7

The ceramic electronic component according to any one of Aspects 1 to 6, wherein the dummy conductor includes an island portion which is spaced apart from the outer edge of the specific surface and is disposed on the specific surface.

Aspect 8

The ceramic electronic component according to Aspect 1, wherein the dummy conductor covers the entire specific surface except for a part thereof which is opened as a marking portion.

Aspect 9

The ceramic electronic component according to any one of Aspects 1 to 8, wherein an internal electrode is disposed inside the main body only in a partial region of the main body when the main body is viewed in a plan view, when the region where the internal electrodes is disposed in a plan view is referred to as a design region, the dummy conductor is disposed outside the design region in the plan view.

1: main body; 1*a*: first surface; 1*b*: second surface; 4, 4*h*, 4*i*, 4*j*, 4*k*, 4*n*, 4*r*, 4*s*, 4*t*, 4*u*: dummy conductor; 5, 5*i*: marking portion; 7: design region; 8: land electrode; 41: annular portion; 42: island portion; 81, 82: straight line; 101, 102, 103, 104, 105, 106, 107, 108, 109, 110, 111, 112, 113, 114,

115, 116, 117: ceramic electronic component; 102*r*: raw material; 1101, 1102, 1103, 1161, 1171, 1181, 1191: line electrode; 1111, 1121, 1122, 1131, 1141, 1142, 1151: capacitor electrode.

The invention claimed is:

1. A ceramic electronic component comprising:

a main body comprising ceramic as a main material and having a first surface and a second surface facing each other;

a dummy conductor disposed to cover at least a portion of an outer edge of a specific surface selected as at least one of the first surface and the second surface; and land electrodes disposed on the second surface, a ridge of an outer periphery of the specific surface of the main body being rounded.

2. The ceramic electronic component according to claim 1, wherein the dummy conductor includes a linear portion extending along at least a portion of the outer edge of the specific surface, and the linear portion includes a first portion being a portion of the outer edge of the specific surface, the first portion being wider than other portions.

3. The ceramic electronic component according to claim 2, wherein the first portion is a corner of the specific surface.

4. The ceramic electronic component according to claim 1, wherein the dummy conductor includes a linear portion extending along at least a portion of the outer edge of the specific surface, and the linear portion includes a second portion being a portion of the outer edge of the specific surface, the second portion being thicker than other portions.

5. The ceramic electronic component according to claim 4, wherein the second portion is a corner of the specific surface.

6. The ceramic electronic component according to claim 1, wherein the dummy conductor is annular and surrounds the specific surface.

7. The ceramic electronic component according to claim 1, wherein the dummy conductor includes an island portion being spaced apart from the outer edge of the specific surface, the island portion being disposed on the specific surface.

8. The ceramic electronic component according to claim 1, wherein the dummy conductor covers an entire portion of the specific surface except for a part being opened as a marking portion.

9. The ceramic electronic component according to claim 1, wherein an internal electrode is disposed inside the main body only in a partial region of the main body when the main body is viewed in a plan view, when the region where the internal electrodes is disposed in a plan view is referred to as a design region, the dummy conductor is disposed outside the design region in the plan view.

10. The ceramic electronic component according to claim 2, wherein the dummy conductor is annular and surrounds the specific surface.

11. The ceramic electronic component according to claim 3, wherein the dummy conductor is annular and surrounds the specific surface.

12. The ceramic electronic component according to claim 4, wherein the dummy conductor is annular and surrounds the specific surface.

13. The ceramic electronic component according to claim 5, wherein the dummy conductor is annular and surrounds the specific surface.

14. The ceramic electronic component according to claim 2, wherein the dummy conductor includes an island portion being spaced apart from the outer edge of the specific surface, the island portion being disposed on the specific surface.

15. The ceramic electronic component according to claim 3, wherein the dummy conductor includes an island portion being spaced apart from the outer edge of the specific surface, the island portion being disposed on the specific surface.

16. The ceramic electronic component according to claim 4, wherein the dummy conductor includes an island portion being spaced apart from the outer edge of the specific surface, the island portion being disposed on the specific surface.

17. The ceramic electronic component according to claim 5, wherein the dummy conductor includes an island portion being spaced apart from the outer edge of the specific surface, the island portion being disposed on the specific surface.

18. The ceramic electronic component according to claim 6, wherein the dummy conductor includes an island portion being spaced apart from the outer edge of the specific surface, the island portion being disposed on the specific surface.

19. The ceramic electronic component according to claim 2, wherein an internal electrode is disposed inside the main body only in a partial region of the main body when the main body is viewed in a plan view, when the region where the internal electrodes is disposed in a plan view is referred to as a design region, the dummy conductor is disposed outside the design region in the plan view.

20. The ceramic electronic component according to claim 3, wherein an internal electrode is disposed inside the main body only in a partial region of the main body when the main body is viewed in a plan view, when the region where the internal electrodes is disposed in a plan view is referred to as a design region, the dummy conductor is disposed outside the design region in the plan view.

* * * * *